United States Patent [19]
Bergerson

[11] Patent Number: 6,090,484
[45] Date of Patent: Jul. 18, 2000

[54] THERMALLY CONDUCTIVE FILLED POLYMER COMPOSITES FOR MOUNTING ELECTRONIC DEVICES AND METHOD OF APPLICATION

[75] Inventor: Steven E. Bergerson, St. Louis Park, Minn.

[73] Assignee: The Bergquist Company, Edina, Minn.

[21] Appl. No.: 08/848,955

[22] Filed: Apr. 30, 1997

Related U.S. Application Data

[63] Continuation of application No. 08/445,303, May 19, 1995, abandoned.

[51] Int. Cl.[7] .......................... B32B 25/08; B32B 27/30; B32B 27/32; B32B 27/36
[52] U.S. Cl. .......................... 428/355 EN; 428/355 CN; 428/421; 428/422; 428/451; 428/474.4; 428/480; 428/519; 428/520
[58] Field of Search .................... 428/328, 329, 428/447, 451, 421, 422, 474.4, 480, 522, 523, 355 CN, 355 AC, 355 N, 355 EN, 910, 517, 519, 520

[56] References Cited

U.S. PATENT DOCUMENTS

| | | | |
|---|---|---|---|
| 2,983,853 | 5/1961 | Williams | 257/717 |
| 3,258,661 | 6/1966 | Mierendorf et al. | 257/687 |
| 3,284,678 | 11/1966 | McBride | 257/687 |
| 3,325,582 | 6/1967 | Ehrmann et al. | 174/16.3 |
| 3,568,012 | 3/1971 | Ernst et al. | 257/786 |
| 3,611,065 | 10/1971 | Zschauer et al. | 257/717 |
| 4,574,879 | 3/1986 | DeGree et al. | 165/185 |
| 4,981,544 | 1/1991 | Nordale | 156/252 |
| 5,024,888 | 6/1991 | Hwo et al. | 428/355 EN |
| 5,028,984 | 7/1991 | Ameen et al. | 257/783 |
| 5,055,909 | 10/1991 | Culver | 257/717 |
| 5,146,981 | 9/1992 | Samarov | 165/185 |
| 5,213,868 | 5/1993 | Liberty et al. | 428/131 |
| 5,258,649 | 11/1993 | Tanaka et al. | 257/787 |
| 5,298,791 | 3/1994 | Liberty et al. | 257/707 |

*Primary Examiner*—D. S. Nakarani
*Attorney, Agent, or Firm*—Haugen Law Firm PLLP

[57] ABSTRACT

A thermally conductive conformable interface layer for use in mounting electronic devices such as transistors or the like onto the surface of a chassis or heat sink. The thermally conductive interface material forms a highly conductive thermal bridge or transfer medium between the external surfaces of the electronic device and the heat sink. The thermally conductive material comprises a multi-layer laminate, typically a polymeric thermally conductive layer along with a film of adhesive bonded thereto. The polymeric layer is preferably a silicone resin, such as polydimethylsiloxane blended with a thermoplastic adhesive such as linear saturated polyester. The polydimethylsiloxane may be filled with a thermally conductive material such as graphite with an adhesive layer being utilized to attach the polymeric layer onto the device and heat sink.

3 Claims, 1 Drawing Sheet

THERMALLY CONDUCTIVE FILLED POLYMER COMPOSITES FOR MOUNTING ELECTRONIC DEVICES AND METHOD OF APPLICATION

This is a continuation of application Ser. No. 08/445,303, filed on May 19, 1995, now abandoned.

BACKGROUND OF THE INVENTION

The present invention is directed to an improved thermally conductive conformable interface layer designed for use in mounting electronic devices such as transistors or the like onto the surface of a chassis or heat sink. The thermally conductive interface material of the present invention is readily conformable, and forms a highly conductive thermal bridge or transfer medium between surfaces of the electronic device and the external surfaces of the electronic device and the heat sink. The devices of the present invention find particular application in use with solid-state electronic devices such as transistors and the like.

The thermally conductive material of the present invention comprises a multi-layer laminate, typically a polymeric thermally conductive layer along with a film of adhesive bonded thereto. While the polymeric layer is preferably a silicone resin, other materials have been found useful such as, for example, certain polyamides including polyester amide copolymers prepared using isophthalic acid, ethylene diamine, ethanol amine, and a diacid prepared from the dimerization of tall oil acid and piperazine. Other useful materials for the preparation of the polymeric layer include polydimethylsiloxane blended with a thermoplastic adhesive such as a linear saturated polyester.

When a polymer layer comprising polydimethylsiloxane is utilized, it is normally filled with a thermally conductive filler such as graphite, and an adhesive layer is utilized to attach the silicone polymeric layer onto the device or onto the heat sink. For ease in handling and processing, a film or liner is utilized for temporarily mounting and supporting the polymeric silicone/adhesive composite. In addition to their desirable mechanical properties and their particularly low thermal resistance, devices prepared in accordance with the present invention are designed to facilitate ease of application to surfaces of electronic devices (typically semiconductors) and also to the surfaces of heat sinks and/or heat spreaders.

In the electronics industry, there is a constant desire, impetus and need to decrease the size of assemblies and sub-assemblies. This results in a corresponding increase in the circuit density. Simultaneously, there is a constant endeavor present to increase the power handling capability of circuitry including micro-circuitry, thereby resulting in the generation of greater quantities of thermal energy or heat. The quantity of thermal energy being generated requires improved methods for removal and dissipation of the heat so that the thermally sensitive components present in the circuits will not deteriorate or fail. At operating temperatures reaching and/or exceeding 80° C., certain components tend to quickly fail, or alternatively, the performance of such components will rapidly deteriorate. Numerous, if not constant, attempts have been made to increase the rate of heat dissipation through the use of polymeric compositions filled with various thermally conductive fillers. Typical of the patents showing these efforts are U.S. Pat. No. 3,908,040, along with others. The present invention represents a significant improvement in the thermal heat dissipation properties of interface layers used for mounting solid-state electronic devices such as transistors or the like onto heat sinks and/or heat spreaders. The devices of the present invention furthermore represent an improvement in facilitating the application of the thermal interface material to the surfaces of the devices which are required to be mounted on a chassis, heat sink or heat spreader.

In one embodiment of the present invention, the polymeric layer of the interface is bonded to the surface of a metallic chassis utilizing a heat-seal or thermally activated adhesive. It is recognized that certain silicone-based polymers such as, for example, some polydimethylsiloxanes, polydiphenylsiloxanes, and/or other siloxane polymers containing siloxane repeating units may be inherently difficult to achieve bonding. One feature of the present invention includes a method for bonding thermoplastic adhesives onto the silicone-based polymeric layer.

Reduction in thermal resistance through the interface may be achieved by utilizing thermally conductive fillers, such as, for example, graphite, alumina, boron nitride, titanium boride, and/or mixtures of these materials.

The interface devices of the present invention are particularly adaptable for use with a conventional hot stamp application machines, including those which are typically used in industry to apply labels to various plastic and/or metal surfaces.

SUMMARY OF THE INVENTION

It is therefore a primary object of the present invention to provide an improved thermal interface to be interposed between a power dissipating thermal energy generating device and a chassis and/or other heat sink.

It is a further object of the present invention to provide a highly thermally conductive interface for use between the surfaces of a solid-state electronic device and a chassis, wherein the interface is easily applied to the appropriate surface during production operations.

It is yet a further object of the present invention to provide an interface which has extremely low thermal resistance, thereby enhancing the ability of the interface structure to conduct heat away from the semiconductor device.

Other and further objects of the present invention will become apparent to those skilled in the art upon a review of the following specification, appended claims and accompanying drawing.

DESCRIPTION OF THE PREFERRED EMBODIMENT

Figure 1:
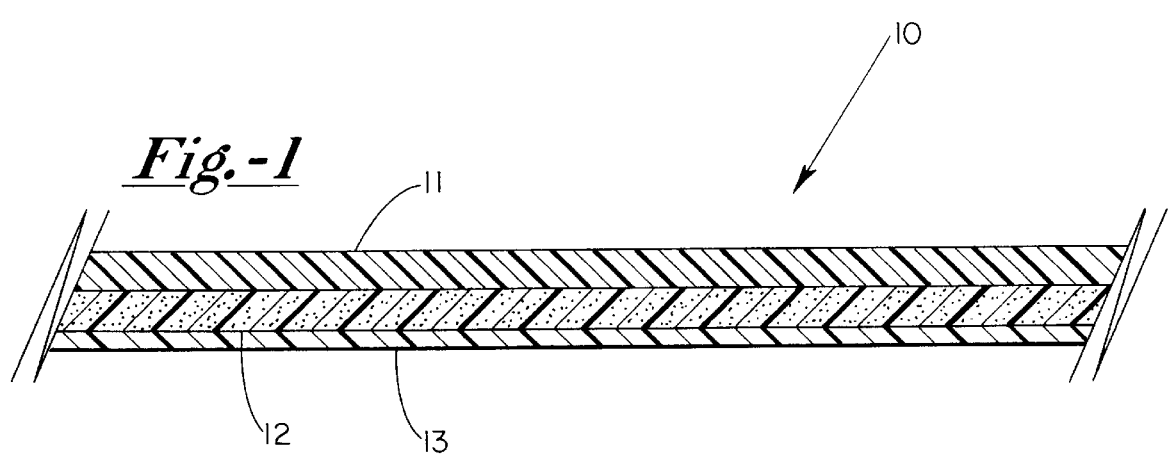
FIG. 1 is a cross-sectional view of a preferred embodiment of the present invention, and illustrating the outer adhesive layer, the inner thermally conductive polymeric layer, and the support liner.

In accordance with the preferred embodiment of the present invention, and with particular attention directed to FIG. 1 of the drawing, the composite thermally conductive interface generally designated 10 includes a polymeric layer 11 having an exposed adhesive layer 12 bonded to one surface thereof. A support/release liner is provided as at 13 for facilitating pre-application handling of the material, with the liner typically being a polyester film such as stress-oriented polyethylene terephthalate or the like. Biaxially oriented polypropylene may also be utilized.

Turning now to the composite, the adhesive layer is preferably a polyester with the following repeating unit:

$$(-R_1-COOR_2-COO-)_{n1}$$

wherein $R_1$ is selected from the group consisting of:

$C_2H_4$ $C_4H_8$ and wherein n1 is an integer having a value of from 10 to 1000, wherein n2 is an integer having a value of from 1 to 50, and wherein n3 is an integer having a value of from 1 to 50. $R_2$ is a radical selected from the group consisting of:

$1, 2C_6H_4$ $CH_2-CH_2-CH_2-CH_2$ $CH_2-CH_2-CH_2$ $1, 3C_6H_4$ $1, 4C_6H_4$ $cis-CH=CH$ and copolymers thereof.

An alternative adhesive layer is a polyamide of the type having the repeating structural unit:

$$(-NH(R_3)NHCO(R_4)CO-)_n$$

and wherein $R_3$ is selected from the group consisting of:

$CH_2-CH_2$ $C_6H_{10}$ and wherein $R_4$ is selected from the group consisting of:

$C_6H_4$ and $CH_2-CH_2-CH_2$

As a still further alternative adhesive layer, a polyacrylate may be utilized having the repeating structural unit:

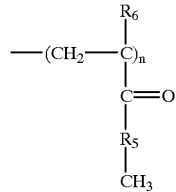

wherein $R_5$ is selected from the group consisting of:

$O-C_6H_{13}$ $-O-C_8H_{16}$ $-O-C_2H_4$ and $R_6$ is selected from the group consisting of: H and $CH_3$. Adhesives of each of these three types are, of course, commercially available. The commercially available polyamide adhesives are available from Henkel Corporation of Gulph Mills, Pennsylvania under the trade designation "MacroMelt 6238" or "MacroMelt 6228". Polyesters which have been found suitable are available under the trade designation "Bostic 7256" from Bostik Corp. of Middleton, Mass. or that adhesive designated "49001" by E.I. DuPont deNemours Corp. of Wilmington, Del.

A property common to each of the adhesives is the melting point of the polymer measured using ASTMD E-28, with the melting point being between 50 degrees C. and 140 degrees C., and preferably between 60 degrees C. and 120 degrees C.

The average molecular weight of polydimethylsiloxane forming this polymer are high, with the average molecular weight typically being greater than 10,000.

In order to provide a mechanism for bonding the adhesive to the polymeric layer, a coupling agent such as silane or other coupling agent known in the art may be utilized. The utilization of a silane coupling agent substantially improves the bond between the thermoplastic adhesive layer and the cured silicone polymeric layer. Suitable coupling agents include triethoxysilanes with various reactive groups including vinyl, epoxy, and amine. These silanes are reactive between both the surfaces of the polymeric layer and the adhesive layer.

The resilient polymeric layer, as indicated, is filled with a conductive filler. Fillers which have been found effective in the present structures include graphite, alumina, boron nitride, alumina trihydrate, diamond, aluminum nitrite, silicone carbide, and others. The preferred fillers have a bulk thermal conductivity of greater than 3.

In order to more fully explain the features of the present invention, the following specific examples are given:

EXAMPLE I

A commercially available gum rubber consisting essentially of units of polydimethylsiloxane having a high average molecular weight, typically of greater than 10,000 was dissolved into a carrier solvent with 400 partsr per hundred of graphite. The content of total solids was 40% by weight. The solution was then coated onto one mil stress-oriented polyethylene terephthalate and cured using 1% benzoyl peroxide. This material was cast with a total thickness of 6 mils. A mixture of a linear unsaturated polyester adhesive was then applied over the silicone/graphite layer. The coating solution consisted of the following:

| Ingredient | Parts per Hundred |
|---|---|
| Polyester resin (Bostik 7256) | 100 parts |
| Graphite | 200 parts |
| Silane (Silane A-1100) | 1 part |

The blend forming the polyester comprised 50% by weight solids. The overall materials were dried in an air-circulating oven at a temperature of 120 degrees C. for a period of 10 minutes.

When applied using standard hot stamping equipment, the silicone and adhesive peeled cleanly from the release liner. The thermal conductivity following ASTM-D-5740 procedures yielded a result of 5 W-m/K. Thermal impedance of the material tested in actual use using a TO-220 TIP 41 gave a thermal impednace of 0.05 degrees C. per Watt. This compares very favorably to that obtained with a similar assembly utilizing grease at 0.06 degrees C. per Watt, and that of 0.09 degrees C. per Watt for a typical graphite-impregnated foil. With reference to FIG. 1 of the drawing, the assembly 10 includes an adhesive layer 11 along with the silicone/graphite layer 12, with these two layers being arranged on the surface of the release liner 13. The release material is preferably stress oriented polyethylene terephthalate (Mylar), it being noted however, that other suitable release liners may be employed such as polypropylene. Other examples set forth hereinafter would be shown in a similar laminate configuration.

Figure 2:
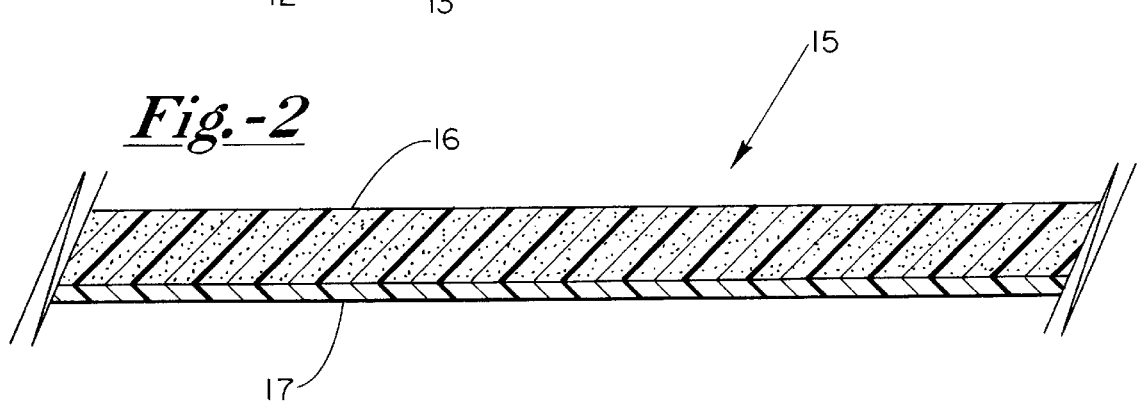
FIG. 2 is a view similar to FIG. 1 and illustrating the typical cross-section of a modified form of the present invention which utilizes a composite layer having thermally conductive and adhesive properties.

As an optional feature of this embodiment of the present invention consists of a single layer of adhesive that will release cleanly from the polyester liner may be used. In this embodiment, a release coating may be used to ensure complete release from the polyethylene terephthalate (Mylar) liner. With attention being directed to FIG. 2 of the drawing, the composite 15 includes a single layer of adhesive except a filler such as the graphite layer set forth above in this example, and with the composite being disposed on a release film 17 of stress oriented polyethylene terephthalate. For this formulation and others, suitable low surface energy films such as fluorinated ethylene-propylene resin, polytetrafluoroethylene, polyvinyldifluoride, and polypropylene may be used.

Adhesives found useful in this embodiment include linear saturated polyesters that are blended with low melting point resins such as microcrystalline wax, rosin acid, a pentaerythritol ester of rosin acid, a glycerol ester of rosin acid and aromatic tackifying resins. The low molecular weight modifiers help to enable the adhesive to melt quickly and form a bond to the heat sink. An example of this embodiment is shown in the following

EXAMPLE II

| Ingredient | Parts per Hundred |
| --- | --- |
| Polyester resin (Bostik 7256) | 100 parts |
| Graphite | 300 parts |
| Foral 85 | 30 parts |

A solvent was added to yield 40% by weight solids. This was coated onto a 1.0 mil polyester and dried at 80 degrees C. for 15 minutes. Using a hot stamp machine, a clean part was applied to a heat sink. Properties measured are:

| | |
| --- | --- |
| Thermal conductivity | 3.0 |
| Thermal impedance to 220 TIP-41 | .09 degrees C. in 2 Watt |
| Thermal resistance | 0.5 degrees C. per Watt. |

The above examples are given for purposes of illustration only and is not to be regarded as a limitation upon the scope of the present invention.

What is claimed is:

1. A laminate comprising a polymeric thermally conductive layer with one of the individual layers being an adhesive film bonded thereto and wherein the adhesive film consists of a blend of a nitrile rubber having a melting point between 60° C. and 120° C. and a tackifying resin selected from the group consisting of coumarone-indene polymer, rosin acid, and rosin ester.

2. The laminate as set forth in claim 1 wherein said laminate is mounted on a supporting substrate.

3. The laminate of claim 2 wherein the supporting substrate is a film selected from the group consisting of stress oriented polyethylene terephthalate, fluorinated ethylene-propylene resin, polytetrafluoroethylene, polyvinyldifluoride, polypropylene.

* * * * *